United States Patent
Onódy et al.

(10) Patent No.: US 11,502,683 B2
(45) Date of Patent: Nov. 15, 2022

(54) CALIBRATION OF DRIVER OUTPUT CURRENT

(71) Applicant: Skyworks Solutions, Inc., Irvine, CA (US)

(72) Inventors: Péter Onódy, Budapest (HU); Tamás Marozsák, Budapest (HU)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/230,060

(22) Filed: Apr. 14, 2021

(65) Prior Publication Data

US 2022/0337238 A1  Oct. 20, 2022

(51) Int. Cl.
| | |
|---|---|
| H03K 3/00 | (2006.01) |
| H03K 17/16 | (2006.01) |
| H02M 1/00 | (2006.01) |
| H02M 3/335 | (2006.01) |
| H03K 17/687 | (2006.01) |
| G05F 1/575 | (2006.01) |

(52) U.S. Cl.
CPC .......... *H03K 17/687* (2013.01); *G05F 1/575* (2013.01)

(58) Field of Classification Search
None
See application file for complete search history.

(56) References Cited

U.S. PATENT DOCUMENTS

| | | | |
|---|---|---|---|
| 7,091,709 | B2 | 8/2006 | Suzuki |
| 7,199,565 | B1 | 4/2007 | Demolli |
| 7,999,523 | B1 | 8/2011 | Caffee et al. |
| 8,947,112 | B2 * | 2/2015 | Yamanobe ............. H03K 17/28 324/750.01 |
| 9,261,892 | B2 | 2/2016 | Wang et al. |
| 9,337,824 | B2 * | 5/2016 | Piselli .................... H03K 17/28 |

(Continued)

FOREIGN PATENT DOCUMENTS

WO  2020086150 A2  4/2020

OTHER PUBLICATIONS

Onsemi, "Single 6 A High-Speed, Low-Side SiC MOSFET Driver," Semiconductor Components Industries, LLC, 2017, Rev. Apr. 3, 2019, Publication Order No. NCP51705/D, 21 pages.

(Continued)

*Primary Examiner* — Kenneth B Wells
(74) *Attorney, Agent, or Firm* — Zagorin Cave LLP

(57) ABSTRACT

A method for driving an output node includes driving a control node of an output device coupled to the output node according to an input signal and using a fixed regulated voltage and a variable regulated voltage. The method includes generating the fixed regulated voltage based on a first power supply voltage, a second power supply voltage, and a first reference voltage. The method includes generating the variable regulated voltage based on the first power supply voltage, the second power supply voltage, and a second reference voltage. The method includes generating the second reference voltage based on the first power supply voltage, the second power supply voltage, a reference current, and a predetermined target voltage level of the control node of the output device. In an embodiment of the method, generating the second reference voltage includes periodically calibrating the second reference voltage.

20 Claims, 3 Drawing Sheets

(56) References Cited

U.S. PATENT DOCUMENTS

| | | |
|---|---|---|
| 9,537,581 B2 | 1/2017 | Mills et al. |
| 9,625,925 B2 | 4/2017 | Yan et al. |
| 9,817,426 B2 | 11/2017 | Chellappa |
| 10,281,943 B1 | 5/2019 | Ho |
| 10,296,026 B2 | 5/2019 | Caffee et al. |
| 10,784,860 B1 | 9/2020 | Sakai |
| 2005/0248331 A1 | 11/2005 | Whittaker |
| 2007/0241731 A1 | 10/2007 | van Ettinger |
| 2008/0054867 A1 | 3/2008 | Soude et al. |
| 2008/0238385 A1 | 10/2008 | Nagata et al. |
| 2008/0303496 A1 | 12/2008 | Schlueter et al. |
| 2009/0295360 A1 | 12/2009 | Hellums |
| 2010/0117699 A1 | 5/2010 | Wu et al. |
| 2010/0156362 A1 | 6/2010 | Xie |
| 2010/0156364 A1 | 6/2010 | Cho et al. |
| 2011/0121802 A1 | 5/2011 | Zhu |
| 2013/0082671 A1 | 4/2013 | Ivanov et al. |
| 2015/0185747 A1 | 7/2015 | Liu |
| 2015/0198960 A1 | 7/2015 | Zhang et al. |
| 2015/0286232 A1 | 10/2015 | Parikh |
| 2016/0224040 A1 | 8/2016 | Peluso et al. |
| 2016/0357206 A1 | 12/2016 | Liu |
| 2017/0093399 A1 | 3/2017 | Atkinson et al. |
| 2017/0115677 A1 | 4/2017 | Caffee et al. |
| 2017/0126329 A1 | 5/2017 | Gorecki et al. |
| 2017/0160757 A1 | 6/2017 | Yang |
| 2017/0244395 A1 | 8/2017 | Ojha et al. |
| 2018/0017984 A1 | 1/2018 | Mayer et al. |
| 2018/0053463 A1 | 2/2018 | Kong et al. |
| 2018/0129234 A1 | 5/2018 | Melgar et al. |
| 2018/0173258 A1 | 6/2018 | Singh |
| 2019/0109529 A1 | 4/2019 | Nobe et al. |

OTHER PUBLICATIONS

Rohm Semiconductors, "Isolation voltage 2500Vrms 1ch Gate Driver Providing Galvanic Isolation," Gate Driver Providing Galvanic Isolation Series, BM60054AFV-C Datasheet, Rev 003, Apr. 23, 2018, 42 pages.

Klomark, S., "Design of an Integrated Voltage Regulator," Institution for Systemteknik, Oct. 17, 2003, 54 pages.

* cited by examiner

CALIBRATION OF DRIVER OUTPUT CURRENT

CROSS-REFERENCE TO RELATED APPLICATION(S)

This application is related to U.S. patent application Ser. No. 17/123,358, entitled "High-Speed Low-Impedance Boosting Low-Dropout Regulator," naming Péter Onódy, Tamás Marozsák, Viktor Zsolczai, and András V. Horváth as inventors, filed on Dec. 16, 2020, which application is incorporated by reference herein, in its entirety.

BACKGROUND

Field of the Invention

This disclosure is related to integrated circuits, and more particularly to circuits that drive varying loads.

Description of the Related Art

Referring to FIG. 1, a conventional driver circuit uses a fixed voltage to drive a gate of output device 106. Regulator 102 receives reference voltage $V_{BGREF}$ generated by a bandgap reference and generates fixed voltage $V_{REG}$ to have a level that is at or near a maximum allowable gate voltage of a target semiconductor manufacturing technology for turning on output device 106. Pre-driver 104 uses fixed voltage $V_{REG}$ to change the state of output device 106 according to the value of input signal IN. The output current of driver circuit 100 can vary substantially in response to changes in temperature. Substantial variation of the output current level can cause electromagnetic interference and can reduce efficiency of a system. Accordingly, improved techniques for driving an output current are desired.

SUMMARY OF EMBODIMENTS OF THE INVENTION

In at least one embodiment, a method for driving an output node includes driving a control node of an output device coupled to the output node according to an input signal and using a fixed regulated voltage and a variable regulated voltage. The method includes generating the fixed regulated voltage based on a first power supply voltage, a second power supply voltage, and a first reference voltage. The method includes generating the variable regulated voltage based on the first power supply voltage, the second power supply voltage, and a second reference voltage. The method includes generating the second reference voltage based on the first power supply voltage, the second power supply voltage, a reference current, and a predetermined target voltage level of the control node of the output device. In an embodiment, generating the second reference voltage includes periodically calibrating the second reference voltage.

In at least one embodiment, an integrated circuit includes an output node and an output device of a first type coupled between the output node and a first power supply node. The integrated circuit includes a pre-driver circuit coupled to the first power supply node and configured to drive a control node of the output device according to an input signal and using a fixed regulated voltage and a variable regulated voltage. The integrated circuit includes a fixed voltage regulator configured to generate the fixed regulated voltage based on a first power supply voltage, a second power supply voltage, and a first reference voltage level. The integrated circuit includes a variable voltage regulator configured to generate the variable regulated voltage based on the first power supply voltage, the second power supply voltage, and a second reference voltage. The integrated circuit includes a reference voltage generator configured to generate the second reference voltage based on the first power supply voltage, the second power supply voltage, a reference current, and a predetermined target voltage level of the control node of the output device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
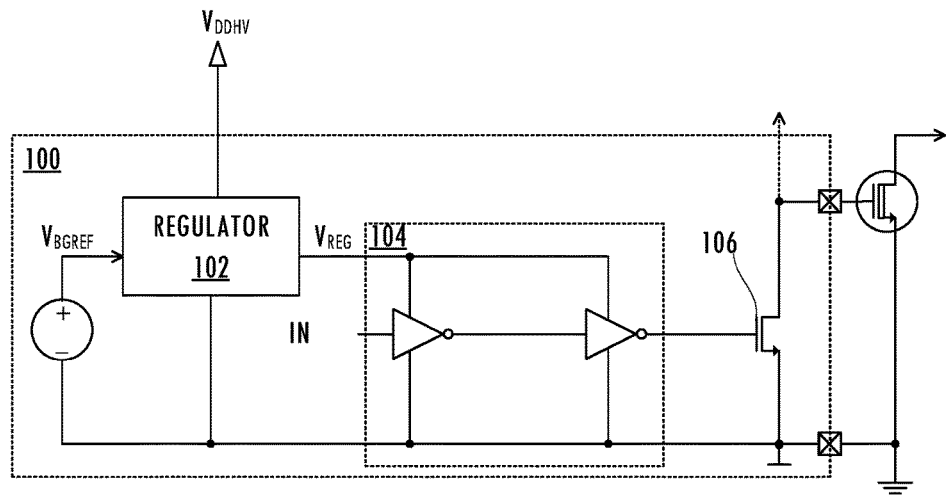
FIG. 1 illustrates a functional block diagram of a conventional driver circuit.
Figure 2:
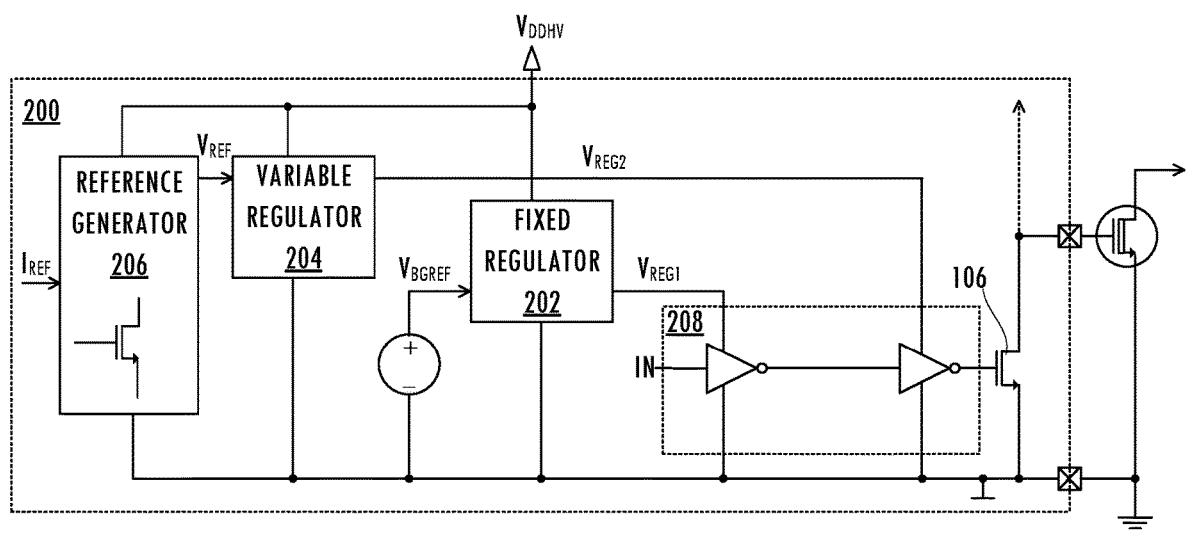
FIG. 2 illustrates a functional block diagram of a driver circuit consistent with at least one embodiment of the invention.

A technique for reducing variation of an output current of a gate driver circuit that improves stability of an application including the gate driver circuit, reduces electromagnetic interference, and improves efficiency of a system including the gate driver circuit is disclosed. Referring to FIG. 2, driver circuit 200 includes pre-driver 208, which is coupled to fixed regulator 202, variable regulator 204, and ground. In at least one embodiment, fixed regulator 202 includes a conventional low-dropout regulator (i.e., a DC linear voltage regulator that maintains a target output voltage level even when the supply voltage is very close to the target output voltage level) that generates regulated voltage $V_{REG1}$ using voltage $V_{BGREF}$ generated by a bandgap reference circuit. In at least one embodiment, variable regulator 204 is a low-dropout regulator that maintains a stable output voltage to a load during a transient, high load condition without substantially impacting dynamic performance of the load. Variable regulator 204 tolerates high load variation without substantial overshoot or undershoot of regulated output voltage $V_{REG2}$. Variable regulator 204 receives reference voltage $V_{REF}$ from reference generator 206. In at least one embodiment, variable regulator 204 generates a boost current in response to a change in the load to maintain a stable output voltage to the load during transient events. Exemplary variable regulators are described in U.S. patent application Ser. No. 17/123,358, entitled "High-Speed Low-Impedance Boosting Low-Dropout Regulator," naming Péter Onódy, Tamás Marozsák, Viktor Zsolczai, and András V. Horváth as inventors, filed on Dec. 16, 2020, although other voltage regulators may be used.

Fixed regulator 202, variable regulator 204, and reference generator 206 are coupled between power supply $V_{DDHV}$ and ground. Although fixed regulator 202 is shown to be coupled to only one inverting buffer and variable regulator 204 is shown to be coupled to only one inverting buffer, in other embodiments, pre-driver 208 includes additional inverting or non-inverting buffer circuits coupled in series and coupled to fixed regulator 202 or variable regulator 204. Reference generator 206 generates reference voltage $V_{REF}$ using reference current $I_{REF}$ and a replica device that is a replica of output device 106. The replica device is a downscaled version of output device 106. For example, the replica device has fewer fingers and a smaller device width (e.g., a factor of N smaller, where Nis an integer). The replica device is coupled in a feedback loop and its gate voltage is used as a reference voltage for variable regulator 204. The feedback loop maintains the gate voltage of the replica device at the same voltage level as the gate voltage of the output device 106 in an ON state. Therefore, the drain current of the replica device can be used to control the output current of driver circuit 200 to maintain a constant output current in response to temperature variation. In at least one embodiment of driver circuit 200, reference current $I_{REF}$ is temperature independent (e.g., generated by a circuit combining a proportional to absolute temperature (PTAT) voltage reference circuit and a bandgap voltage reference circuit) and is calibrated during production.

Figure 3:
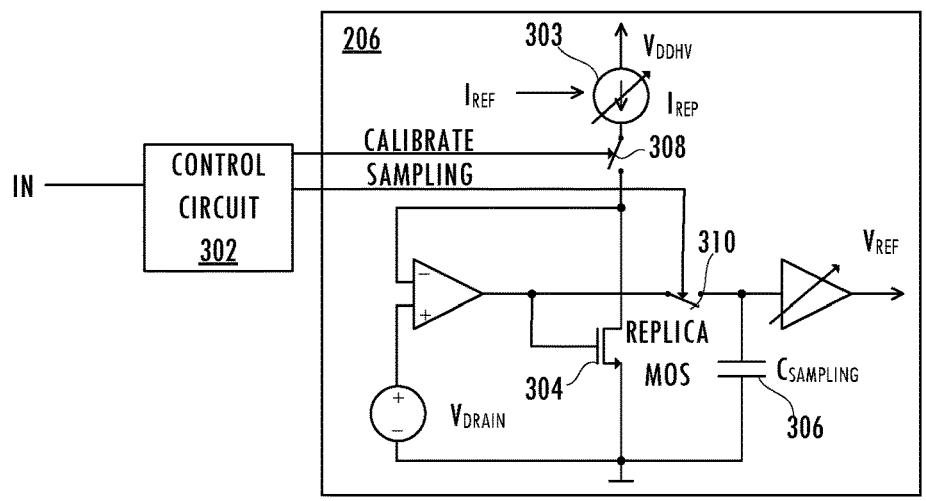
FIG. 3 illustrates a circuit diagram of a reference generator circuit for use with the driver circuit of FIG. 2 consistent with at least one embodiment of the invention.

Referring to FIGS. 2 and 3, in at least one embodiment, reference generator 206 receives reference current $I_{REF}$ from a bias current circuit. In at least one embodiment of driver circuit 200, reference current $I_{REF}$ is compensated for variations due to temperature variation. In an embodiment, current source 303 includes a digital-to-analog converter and current mirrors that generate replica current $I_{REP}$ using reference current $I_{REF}$. Replica current $I_{REP}$ is a downscaled version of a target output current (e.g., the target drain current of output device 106). In an embodiment, the scaling ratio of the replica current to the drain current of output device 106 is the same as the scaling ratio of the physical size of replica device 304 to the physical size of output device 106. In at least one embodiment of driver circuit 200, output device 106 and replica device 304 use a multiple finger layout for the gate terminal. In at least one embodiment of driver circuit 200, output device 106 and replica device 304 use a single finger layout of the gate. In at least one embodiment, replica device 304 is at least one order of magnitude smaller than output device 106, but actual sizes vary with manufacturing technology. In an exemplary embodiment, output device has a 200 µm gate width and a corresponding replica device has a 40-50 µm gate width. In at least one embodiment, replica current $I_{REP}$ is 10 µA and the output current is 10 mA.

Since in practice, downscaling is not implemented perfectly, replica current $I_{REP}$ is adjustable and is calibrated circuit production test. Replica device 304 is coupled in a feedback loop that sets the gate voltage of replica device 304 to match the drain current of replica device 304 to replica current $I_{REP}$, and to match the drain voltage of the replica device to a target voltage level (e.g., approximately $V_{DDHV}/2$). Since downscaling affects the temperature behavior of a device, a digitally programmable gain stage coupled to sampling capacitor 306 is included to compensate for effects of temperature variation and to adjust the level of reference voltage $V_{REF}$ to a level suitable for variable regulator 204. The combination of an A adjustable replica current $I_{REP}$ and adjustable gain reduce or minimize effects of temperature variation on the output current of driver circuit 200.

Figure 4:
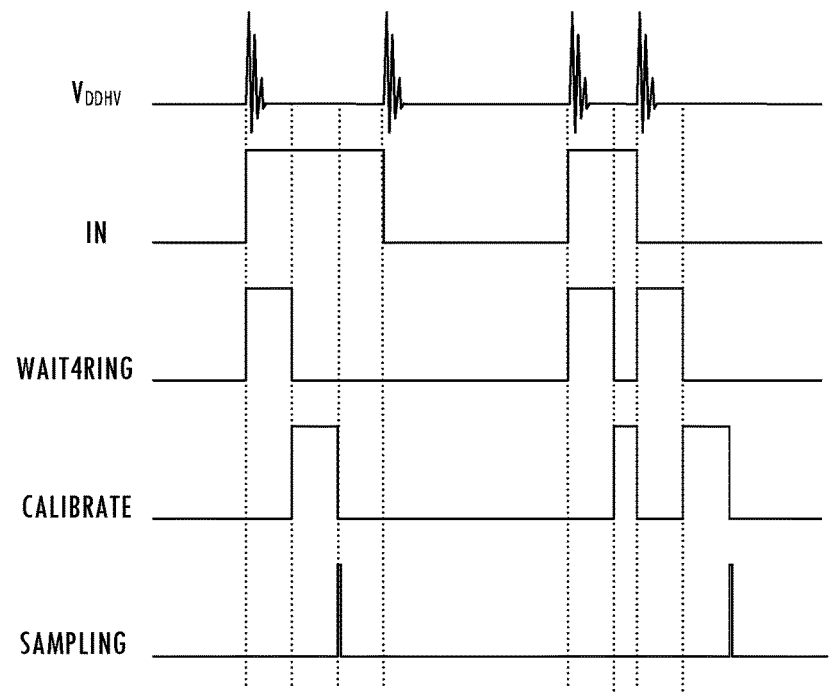
FIG. 4 illustrates timing diagrams for control signals of the reference generator of FIG. 3 consistent with at least one embodiment of the invention.

Although replica current $I_{REP}$ is less than the output current of driver circuit 200 due to downscaling, continuous operation of reference generator 206 still generates relatively high current. Therefore, reference generator 206 is configured to operate only periodically and the gate voltage is stored using sampling capacitor 306. In at least one embodiment, control circuit 302 causes reference generator 206 to periodically calibrate reference voltage $V_{REF}$, e.g., by refreshing charge loss of sampling capacitor 306 due to leakage current and compensating for temperature variation. In an embodiment, the periodic calibration is synchronized to switching of the state of input signal IN to reduce or eliminate effects of ringing of the signal on internal power supply node $V_{DDHV}$ due to high current change in bond wire inductance during switching. An exemplary control sequence for synchronized calibration is illustrated in FIG. 4.

The target period for the calibration is a tradeoff between increased average current and effects of leakage current. Periodic calibration increases the average current and if periodic calibration occurs too frequently, the average current may exceed a target current budget for driver circuit 200. If the periodic calibration is too infrequent, leakage current will significantly reduce the voltage of the sampling capacitor. If no transition of the input signal occurs in a target timing window for synchronized calibration, then control circuit 302 triggers a calibration cycle after a predetermined amount of time since the last calibration regardless of the value of the input signal.

In at least one embodiment of driver circuit 200, control circuit 302 begins a synchronized calibration cycle of the periodic calibration in response to a transition of input signal IN. The transition of input signal IN causes reference generator 206 to enter a first phase of the calibration cycle that allows for sufficient damping of ringing of the signal on power supply node $V_{DDHV}$. For example, control circuit 302 asserts control signal WAIT4RING and triggers a timer that allows for sufficient damping of ringing on power supply node $V_{DDHV}$. After the timer reaches a predetermined value corresponding to a predetermined time elapsed, control circuit 302 causes reference generator 206 to enter a second phase of the calibration cycle. For example, control circuit 302 de-asserts control signal WAIT4RING and asserts control signal CALIBRATE. Control signal CALIBRATE closes switch 308, which couples current source 303 to a drain terminal of replica device 304, thereby enabling the feedback loop to match the drain current of replica device 304 to replica current $I_{REP}$. Control circuit 302 asserts control signal CALIBRATE for a second predetermined amount of time that is sufficient to achieve stabilization of the calibration loop. After the second predetermined amount of time elapses, the calibration loop is stabilized and control circuit 302 causes reference generator 206 to enter a sampling phase of the calibration cycle. For example, control circuit 302 de-asserts control signal CALIBRATE and pulses control signal SAMPLING, which causes reference generator 206 to close switch 310 just long enough to sample the gate voltage of replica device 304 using sampling capacitor 306. If input signal IN changes during a calibration cycle, control circuit 302 interrupts the calibration cycle and restarts the calibration cycle synchronously to that new transition of input signal IN.

In at least one embodiment, the damping time is approximately 100 ns (e.g., WAIT4RING is asserted for 100 ns), and the calibration phase takes approximately 300 ns. In at least one embodiment, the charging time of the calibration capacitor is approximately 30 ns (e.g., SAMPLING=30 ns), the minimum time between two calibrations is 100 s, and the maximum time between two calibrations is approximately 200 s. In general, the sampling time (e.g., the time control signal SAMPLING is asserted) is much smaller than the calibration phase. In an exemplary embodiment, the average current consumption is approximately 60 µA although the calibration current is approximately 10 mA, including high side and low side calibration (e.g., 60 µA=(300 ns/100 µs)×10 mA×2).

Figure 5:
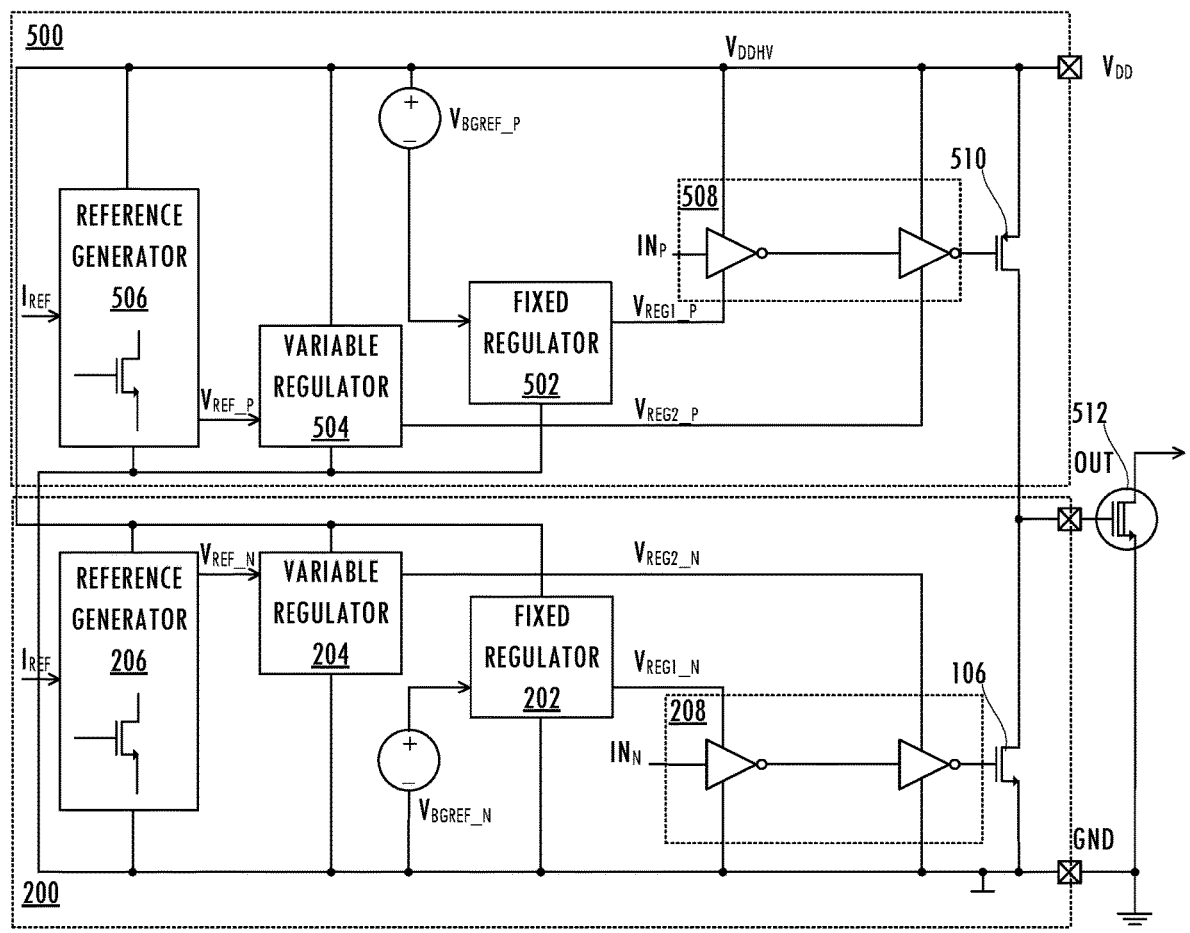
FIG. 5 illustrates a functional block diagram of a driver circuit including a pull-up output device and a pull-down output device consistent with at least one embodiment of the invention.

Referring to FIG. 5, in an exemplary gate driver application, driver circuit 200 is coupled to a pull-down output drive device. Circuits that are complementary to pre-driver 208, reference generator 206, variable regulator 204, and fixed regulator 202 (e.g., pre-driver 508, reference generator 506, variable regulator 504, and fixed regulator 502) are included in driver circuit 500, which is coupled to a pull-up drive device. Drive device 510 and drive device 106 source and sink currents, respectively, through output terminal OUT, which is coupled to a high-voltage drive device 512. In at least one embodiment, driver circuit 500 provides output current with variation of less than ±20%. In at least one embodiment of a driver product, control circuit 302 sequentially calibrates driver circuit 200 and driver circuit 500 to allow sharing of circuit elements (e.g., a shared current source or a shared loop amplifier). In at least one other embodiment of a driver product, driver circuit 200 and driver circuit 500 do not share circuitry and are calibrated concurrently.

Thus, embodiments of a gate driver product that provides a substantially constant output current are described. The substantially constant output current increases stability of performance in an environment including temperature variation, thereby reducing electromagnetic interference and increasing efficiency of the application (e.g., a motor control application) using the gate driver product. The description of the invention set forth herein is illustrative and is not intended to limit the scope of the invention as set forth in the following claims. For example, while the invention has been described in an embodiment in which the calibration technique is implemented in a gate driver application, one of skill in the art will appreciate that the teachings herein can be utilized with other applications. The terms "first," "second," "third," and so forth, as used in the claims, unless otherwise clear by context, is to distinguish between different items in the claims and does not otherwise indicate or imply any order in time, location, or quality. Variations and modifications of the embodiments disclosed herein may be made based on the description set forth herein, without departing from the scope of the invention as set forth in the following claims.

What is claimed is:

1. A method for driving an output node with a constant current, the method comprising:
    driving a control node of an output device coupled to the output node according to an input signal and using a fixed regulated voltage and a variable regulated voltage;
    generating the fixed regulated voltage based on a first power supply voltage, a second power supply voltage, and a first reference voltage;
    generating the variable regulated voltage based on the first power supply voltage, the second power supply voltage, and a second reference voltage; and
    generating the second reference voltage based on the first power supply voltage, the second power supply voltage, a reference current, and a predetermined target voltage level of the control node of the output device.

2. The method as recited in claim 1 wherein generating the second reference voltage comprises periodically calibrating the second reference voltage.

3. The method as recited in claim 2 wherein periodically calibrating the second reference voltage comprises:
    after the first power supply voltage stabilizes, providing a replica current to a replica device by downscaling the reference current by a predetermined amount, the replica device being a version of the output device downscaled by the predetermined amount; and
    after a control voltage of the replica device stabilizes, sampling the control voltage of the replica device using the replica current.

4. The method as recited in claim 2 wherein generating the second reference voltage further comprises enabling periodic calibration after a delay sufficient to damp ringing of the first power supply voltage in response to a change in state of the input signal from a first level to a second level, thereby synchronizing the calibrating to the input signal.

5. The method as recited in claim 1 wherein generating the variable regulated voltage further comprises:
    maintaining a control voltage of a replica device at a level that corresponds to the predetermined target voltage level of the control node of the output device, the replica device being a version of the output device downscaled by a predetermined amount; and
    boosting the control voltage by the predetermined amount to generate the second reference voltage.

6. The method as recited in claim 1 further comprising:
    driving a second control node of a second output device coupled to the output node according to the input signal and using a second fixed regulated voltage and a second variable regulated voltage, the second output device being complementary to the output device;
    generating the second fixed regulated voltage based on the first power supply voltage, the second power supply voltage, and a third reference voltage;
    generating the second variable regulated voltage based on the first power supply voltage, the second power supply voltage, and a fourth reference voltage; and
    generating the fourth reference voltage based on the first power supply voltage, the second power supply voltage, the reference current, and a second predetermined target voltage level of the control node of the output device.

7. The method as recited in claim 6 wherein the output node is coupled between a drain terminal of the output device and a second drain terminal of the second output device.

8. The method as recited in claim 1 wherein driving the control node comprises:
    driving an intermediate signal according to the input signal and using the fixed regulated voltage; and
    driving the control node according to the intermediate signal and using the variable regulated voltage.

9. An integrated circuit comprising:
    an output node;
    an output device of a first type coupled between the output node and a first power supply node;
    a pre-driver circuit coupled to the first power supply node and configured to drive a control node of the output device according to an input signal and using a fixed regulated voltage and a variable regulated voltage;
    a fixed voltage regulator configured to generate the fixed regulated voltage based on a first power supply voltage, a second power supply voltage, and a first reference voltage level;

a variable voltage regulator configured to generate the variable regulated voltage based on the first power supply voltage, the second power supply voltage, and a second reference voltage; and a reference voltage generator configured to generate the second reference voltage based on the first power supply voltage, the second power supply voltage, a reference current, and a predetermined target voltage level of the control node of the output device.

10. The integrated circuit as recited in claim 9 wherein the reference voltage generator is configured to periodically calibrate the second reference voltage.

11. The integrated circuit as recited in claim 9 wherein the reference voltage generator comprises a replica device, the replica device being a version of the output device downscaled by a predetermined amount.

12. The integrated circuit as recited in claim 11 wherein the reference voltage generator further comprises a replica current generator selectively coupled to the replica device and configured to generate a replica current based on the reference current and the predetermined amount.

13. The integrated circuit as recited in claim 12 wherein the reference voltage generator further comprises a buffer configured to boost a control voltage on a second control node of the replica device by the predetermined amount to generate the second reference voltage.

14. The integrated circuit as recited in claim 13 wherein the reference voltage generator further comprises a sampling capacitor coupled to the buffer and selectively coupled to the second control node of the replica device.

15. The integrated circuit as recited in claim 14 wherein the reference voltage generator further comprises a first switch coupled between the sampling capacitor and the control node of the replica device and the integrated circuit further comprises a control circuit configured to provide a control signal that periodically causes the first switch to couple the control node of the replica device to the sampling capacitor.

16. The integrated circuit as recited in claim 15 wherein the reference voltage generator further comprises a second switch coupled between a current source and the replica device, the control circuit being further configured to provide a second control signal that periodically causes the second switch to couple the replica device to the replica current generator.

17. The integrated circuit as recited in claim 13 wherein the reference voltage generator further comprises a feedback circuit configured to maintain the control voltage of the replica device at a level that corresponds to a predetermined output voltage of the output device.

18. The integrated circuit as recited in claim 9 wherein the pre-driver circuit comprises:

a first driver configured to drive an intermediate node according to the input signal using the fixed regulated voltage; and a second driver configured to drive the control node according to an intermediate signal on the intermediate node using the variable regulated voltage.

19. The integrated circuit as recited in claim 9 further comprising:

a second output device coupled between the output node and a second power supply node, the second output device having a second type, the second type being complementary to the first type;

a second pre-driver circuit configured to drive a second control node of the second output device responsive to the input signal and using a second fixed regulated voltage and a second variable regulated voltage;

a second fixed voltage regulator configured to generate the second fixed regulated voltage based on the first power supply voltage, the second power supply voltage, and a third reference voltage;

a second variable voltage regulator configured to generate the second variable regulated voltage based on the first power supply voltage, the second power supply voltage, and a fourth reference voltage; and a second reference voltage generator configured to generate the fourth reference voltage based on the first power supply voltage, the second power supply voltage, a second reference current, and a second predetermined target voltage level of the second control node of the second output device.

20. An apparatus comprising:

means for driving a control node of an output device coupled to an output node according to an input signal and using a fixed regulated voltage and a variable regulated voltage, the variable regulated voltage being based on a first power supply voltage, a second power supply voltage, and a reference voltage; and means for generating and periodically calibrating the reference voltage based on the first power supply voltage, the second power supply voltage, a reference current, and a predetermined target voltage level of the control node of the output device.

* * * * *